(12) United States Patent
Fanet et al.

(10) Patent No.: US 9,257,981 B2
(45) Date of Patent: Feb. 9, 2016

(54) LOW CONSUMPTION LOGIC CIRCUIT WITH MECHANICAL SWITCHES

(71) Applicant: COMMISSARIAT A L'ENERGIE ATOMIQUE ET AUX ENE ALT, Paris (FR)

(72) Inventors: Herve Fanet, Revel (FR); Marc Belleville, Saint Egreve (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 0 days.

(21) Appl. No.: 14/452,698

(22) Filed: Aug. 6, 2014

(65) Prior Publication Data

US 2015/0048864 A1 Feb. 19, 2015

(30) Foreign Application Priority Data

Aug. 14, 2013 (FR) ..................................... 13 58016

(51) Int. Cl.
*H03K 19/00* (2006.01)
*B81B 7/02* (2006.01)

(52) U.S. Cl.
CPC .............. *H03K 19/0019* (2013.01); *B81B 7/02* (2013.01); *B81B 2201/01* (2013.01)

(58) Field of Classification Search
USPC ..................................... 326/93–98, 112, 114
See application file for complete search history.

(56) References Cited

U.S. PATENT DOCUMENTS

| 6,009,021 | A | * | 12/1999 | Kioi | 365/189.06 |
| 2011/0002168 | A1 | * | 1/2011 | Schepens et al. | 365/185.08 |
| 2011/0121813 | A1 | * | 5/2011 | Sato et al. | 323/349 |

(Continued)

FOREIGN PATENT DOCUMENTS

| EP | 0 626 758 A2 | 11/1994 |
| EP | 2 549 654 A1 | 1/2013 |

OTHER PUBLICATIONS

French Preliminary Search Report issued Apr. 22, 2014 in French Application 13 58016, filed on Aug. 14, 2013 ( with English Translation of Categories of Cited Documents).

(Continued)

*Primary Examiner* — Douglas W Owens
*Assistant Examiner* — James H Cho
(74) *Attorney, Agent, or Firm* — Oblon, McClelland, Maier & Neustadt, L.L.P.

(57) ABSTRACT

Adiabatic logic circuit having a first and a second inputs, a first and a second outputs and at least one supply and synchronization input (Phi), with this circuit comprising:
 a first logic device comprising at least one first microelectromechanical and/or nanoelectromechanical switch, referred to as first mechanical switch, controlled by a first input and connected to the first output and to the supply and synchronization input,
 a second logic device opposite the first logic device comprising at least one second microelectromechanical or nanoelectromechanical switch, referred to as second mechanical switch, controlled by the second input and connected to the second output and to the supply and synchronization input,
 first and second devices for partial discharging connected respectively between the first output and the supply and synchronization input and between the second output and the supply and synchronization input.

14 Claims, 5 Drawing Sheets

(56) References Cited

U.S. PATENT DOCUMENTS

2013/0021714 A1    1/2013  Fanet
2013/0127494 A1*   5/2013  Liu et al. .................. 326/40

OTHER PUBLICATIONS

Kazukiyo Takahashi et al. "An Ultra-Low Power Expandable 4-Bit Adder/Subtracter IC Using Adiabatic Dynamic CMOS Logic Circuit Technology", Extended Abstracts of the International Conference on Solid State Devices and Materials, Japan Society of Applied Physics, XP-000935082, 1999, 2 pages, no month.

William C. Athas, et al., Low-Power Digital Systems Based on Adiabatic-Switching Principles IEEE Transactions on Very Large Scale Integration (VLSI) Systems, vol. 2, No. 4, Dec. 1994, pp. 398-407.

Owen Y. Loh, et al., "Nanoelectromechanical contact switches" Nature Nanotechnology, vol. 7, 2012, pp. 283-295, no month.

Matthew Spencer, et al., "Demonstration of Integrated Micro-Electro-Mechanical Relay Circuits for VLSI Applications" IEEE Journal of Solid-State Circuits, vol. 46, No. 1, Jan. 2011, pp. 308-320.

Adam Fruehling, et al., "Nano-switch for Study of Gold Contact Behavior" IEEE Sensors 2009 Conference, 2009, 5 pages, no month.

J.G.Koller, et al., "Thermal Logic Circuits" USC Information Sciences Institute, 1994, pp. 119-127, no month.

Philip Teichmann, "Chapter 2: Fundamentals of Adiabatic Logic" Adiabatic Logic, Future Trend and System Level and Perspective, 2012, 19 pages, no month.

P. Bergstrom, et al., "Micromechanical Logic" University of Minnesota Department of Electrical Engineering, 2009, 2 pages, no month.

\* cited by examiner

LOW CONSUMPTION LOGIC CIRCUIT WITH MECHANICAL SWITCHES

TECHNICAL FIELD AND PRIOR ART

This invention relates to a low-consumption logic circuit.

Logic circuits of the current state of the art are carried out in CMOS ("Complementary Metal-Oxide Semiconductor") technology which associates a pair of complementary transistors, one of the N type, the other of the P type, on the same support.

In particular due to the development of autonomous electronic systems, it is sought to control the consumption of integrated circuits in order to reduce it. Several solutions can be implemented, one consists in reducing the supply voltage of the circuits, indeed, the so-called dynamic consumption is proportional to the square of this voltage, the other solution consists in favouring the implementation of several circuits that operate at relatively slow frequencies in relation to a system that operate at a high frequency. However these solutions have limits linked to the reduction in the size of transistors.

There is another solution called adiabatic logic which consists in optimally controlling the charges and discharges of the capacitors of an integrated circuit, with these capacitors being primarily those of the interconnection lines which are in general greater than those of transistors. Adiabatic logic is described in the document W C Athas, "Low power Digital systems based on adiabatic switching principles", IEEE transactions on VLSI systems VOL 2, N04 December 1994.

A logic inverter with conventional CMOS technology comprises a transistor p and a transistor n. Any logic function is performed by a combination of transistors in series or in parallel.

In conventional logic, at each change of state, the capacitor CL of the interconnection lines is charged at the supply voltage VDD then discharged to the ground. Energy is therefore dissipated thermally and is written:

$$E = C_L \cdot V_{DD}^2$$

It can be shown theoretically that in order to minimise the energy dissipated by the Joule effect in the resistor in series with a capacitor, it must be guaranteed that the operations of charging and discharging are performed at a constant current which is not the case in conventional logic. In this case, it is easy to show that the energy dissipated during the time T during which the capacitor is charged or discharged is written:

$$E = \frac{RC_L}{T} \cdot C_L \cdot V_{DD}^2$$

The resistance R is the sum of the resistances between the supply and the input of the interconnection line (resistance of the switch used+resistances of the connection lines). In order to establish this result, it is sufficient to solve the system of equations:

$Q = iT$ $Q = C_L V_{DD}$ $E = Ri^2 T$

Q is the charge stored in the capacitor of the interconnection line (in fact this capacitor plus the input capacitor for the following stage but in general lower).

The constant charge and discharge current is i.

The voltage to be established on the interconnection line is the supply voltage (with the charge considered to be practically full).

T is the time during which the interconnection line is charged or discharged.

In practice, in order to approach this ideal condition, circuits proposed to date are based on a linear variation in the supply voltage during the charging and discharging operations of the capacitors which reverts to the first order of working at a constant current. The case of the inverter makes it possible to specify this method of operation.

In adiabatic logic, in the case of the inverter, the supply voltage is not longer constant as in conventional logic, but is established relatively slowly at each change of state. The inputs are positioned then the supply voltage $V_{alim}$ is progressively brought to the nominal voltage VDD during a time T, which makes it possible to establish the output level then to transmit this level to the following gates. The opposite operation is then performed in order to reset the system and process another logic event. In the same way, the supply voltage $V_{alim}$ is then relatively slowly lowered from $V_{DD}$ to zero.

Insofar as the capacitor CL is charged and discharged slowly in relation to the typical time constant of the circuit RCL, with R being the total resistance associated with the charging and discharging process, which includes the output resistance of the transistor or transistors performing the functions F as well as the resistance of the connections, the voltage at the terminals of the capacitor CL can follow the voltage applied at the input. The voltage at the terminals of the resistor is therefore practically zero and the thermal consumption can therefore be reduced substantially in relation to conventional logic.

The energy dissipated during the charge can then be written as in the ideal case of the charge at a constant current:

$$E = \frac{RC_L}{T} \cdot C_L \cdot V_{DD}^2$$

During the discharge an equivalent energy is dissipated.

Consequently the energy dissipated as adiabatic logic can be substantially reduced as long as the period T is must higher than the time constants RCL.

En practice, the trapeze shape of the supply voltage is often replaced with a sinusoidal signal or partially sinusoidal which is easier to generate and which constitutes a suitable approximation.

This logic has however not given rise to any industrial creation. Indeed, the calculation exposed hereinabove ignores a characteristic of the transistors carried out in a semiconductor-based technology namely the threshold effect. In order to render the transistor (or transistors) conductors in the charge or discharge phase of the capacitors, the control voltage applied to the gate must exceed a value called the threshold voltage and noted as VT in CMOS technology. In general the control voltage and the supply voltage are of the same value in order to simplify the architecture. In the case of the inverter in conventional logic, when the input is at the state "0", the PMOS transistor becomes a conductor when the supply voltage is greater than the threshold voltage of the transistor. In this case, a voltage difference will appear at the terminals of the resistor R in the charge (or discharge) process as long as the transistor is not a conductor. This value varies from 0 to VT during the cycle. A non-negligible current then appears at the terminals of the resistor and generates a thermal dissipation.

The energy dissipated in the charge process can be written as a first approximation:

$$E = \frac{RC_L}{R} \cdot C_L \cdot V_{DD}^2 + \frac{1}{2} C_L \cdot V_T^2$$

In order to reduce this negative effect the threshold voltage VT has to be reduced to a value close to 0, but in the CMOS technology this solution cannot be applied car because this would result in a static consumption that is intolerable due to the current under the threshold. The static consumption is linked to the leakage current of the transistors (residual conduction below the threshold), it varies exponentially with the decrease in the threshold voltage and VT/VDD ratios greater than 0.2 and even 0.4 in low-consumption technologies are required.

Consequently, adiabatic logic theoretically of great interest is not able to largely reduce the consumption of the circuits carried out semiconductor switch technology, which has threshold effects.

DESCRIPTION OF THE INVENTION

It is consequently the purpose of this invention to offer a logic circuit with very low power consumption.

The aforementioned purpose is achieved by an adiabatic logic circuit that has at least one first and one second inputs, a first and a second outputs and a supply and synchronisation input that delivers an adiabatic supply voltage, with this circuit comprising:
 a first logic device comprising at least one microelectromechanical or MEMS or nanoelectromechanical NEMS switch controlled at least partially by the first input and intended to connect the first output and the supply and synchronisation input,
 a second logic device comprising at least one MEMS/NEMS switch controlled at least partially by the second input and intended to connect the second output and the supply and synchronisation input,
 a first and a second device providing an at least partial discharge of the first output to the supply and synchronisation input and of the second output to the supply and synchronisation input.

Advantageously, the first and the second discharge devices comprise respectively at least one switch.

Preferably, the switches of the discharge devices have a hysteresis cycle. The bistable switch is a particular case of a switch with a hysteresis cycle. These switches advantageously have the following behaviour:
the variation in the resistor according to the control voltage following the following changes: it switches from a very high value (Roff) to a low value (Ron) when the control voltage is greater than a voltage VPI but returns to the value Roff only if the control voltage is less than a value VRL, with this value being advantageously largely lower than VPI. It is then shown that the non-adiabatic dissipation that varies with the square of VRL is low when the value of VRL is low and that the adiabatic dissipation proportional to Ron is low when the value of Ron is low. In addition, in order to reduce the static consumption it is advantageous to have a value Roff as high as possible. Ron and Roff can vary slightly between VRL and VPI. An excessive increase in Ron however results in an increase in the dissipation. These properties can be obtained with electromechanical switches but they cannot be obtained with semi-conductor-based MOSFets transistors.

The switches are for example MEMS/NEMS switches, they can be controlled electrostatically, piezoelectrically, magnetically or thermally.

An adiabatic supply voltage refers to a supply voltage established relatively slowly, with this supply voltage then being lowered relatively slowly in such a way that it charges and discharges an interconnection line at an almost constant current.

In other terms, the logic unit or circuit performing a logic function according to the invention, comprises a logic function and its inverse logic function operating in adiabatic logic. Each logic function comprises at least one input and one output. The logic unit also comprises at least one supply and synchronisation input to apply the supply voltage in adiabatic logic, with the logic function and its inverse logic function implementing microelectromechanical or MEMS or nanoelectromechanical or NEMS switches. The logic unit also comprises means able to maintain the connection between the output and the supply and synchronisation input after the input has changed state as such providing an at least partial adiabatic discharge of the output with the supply and synchronisation input.

In advantageous embodiments, the connection between the output and the supply and synchronisation input can be maintained until the output is fully discharged. A fully adiabatic discharge is thus obtained.

In an embodiment, a connection to the ground of the output can be provided in order to prevent the influence of charges that can disturb the output of the circuit.

The subject-matter of this invention then is an adiabatic logic circuit comprising at least one first and one second inputs, one first and one second outputs and at least one supply and synchronisation input, with this circuit comprising:
 a first logic device comprising at least one first microelectromechanical and/or nanoelectromechanical switch, referred to as first logic switch, at least partially controlled by the first input and connected to the first output and to the supply and synchronisation input,
 a second logic device referred to as complementary that provides a complementary logic function of the first logic device comprising at least one second microelectromechanical and/or nanoelectromechanical switch, referred to as second logic switch, at least partially controlled by the second input and connected to the second output and to the supply and synchronisation input,
 first and second devices for discharging connected respectively between the first output and the supply and synchronisation input and between the second output and the supply and synchronisation input, said first and second devices for discharging providing an at least partial discharge of the first and second outputs.

According to the invention the supply and synchronisation input is a power clock that makes it possible to provide an electrical supply to the logic circuit as well as synchronise the logic signals. Advantageously this supply also makes it possible to recover a substantial portion of the electrical energy supplied to the circuit in such a way as to form an adiabatic power clock.

According to the invention, the first and second inputs can allow respectively for the introducing into the logic circuit of one or several logic signals.

Advantageously, the first and second devices for discharging comprise respectively at least one microelectromechanical and/or nanoelectromechanical switch, referred to as discharge switch.

In an embodiment, the first output is connected to the ground by the intermediary of a third complementary logic device of the first logic device and controlled by the second input and the second output is connected to the ground by the intermediary of a fourth complementary logic device of the second logic device and controlled by the first input.

The third logic device can comprise a first microelectromechanical and/or nanoelectromechanical connection switch to the ground, said first connection switch to the ground being controlled in such a way as to be in a state opposite that of the first logic switch, and the fourth logic device comprises a second microelectromechanical and/or nanoelectromechanical connection switch to the ground, said second connection switch to the ground being controlled in such a way as to be in a state opposite that of the second logic switch.

According to an additional characteristic, all or a portion of the logic switches are bistable switches.

Bistable switches in relation to conventional switches, comprise a control electrode in order to open the switch and a control electrode in order to close the switch; these switches retain their state (open or closed) when the controls are inactive. This effect of bistability of the logic switches is by a known manner obtained by the design of said switches.

The first and second discharge devices can be controlled respectively by the first output and the second output.

According to another embodiment example, the logic circuit comprises at least one first supply synchronisation and preferentially a second synchronisation input, and with each one of the first and second devices for discharging preferentially comprising at least three microelectromechanical and/or nanoelectromechanical switches, wherein one of the three switches of the first device for discharging is intended to perform the connection between the first output and the supply and synchronisation input, another among the three switches of the first device for discharging is controlled by the first synchronisation input in such a way as to maintain the connection between the first output and the supply and synchronisation input until the first output is fully discharged, by maintaining the switch as a conductor, and preferentially the second synchronisation input provides the connection between the first output and the supply and synchronisation input by closing another of the three switches of the first device for discharging in an inactive phase of the logic circuit, and wherein one of the three switches of the second device for discharging is configured to perform the connection between the second output and the supply and synchronisation input, another among the three switches of the second device for discharging is controlled by the first synchronisation input in such a way as to maintain the connection between the second output and the supply and synchronisation input until the second output is fully discharged, by maintaining the switch as a conductor, and the second synchronisation input provides the connection between the second output and the supply and synchronisation input by closing another of the three switches of the second logic discharge device in an inactive phase of the logic circuit.

In another embodiment example, the first logic switch of the first logic device forms a portion of the first device for discharging, said first logic switch being controlled in terms of closing and opening, said first logic switch being controlled in such a way as to ensure the full discharge of the first output, and wherein the second logic switch of the second logic device forms a portion of the second device for discharging, said second logic switch being controlled in terms of closing and opening, said second logic switch being controlled in such a way as to ensure the full discharge of the second output.

In another embodiment example, the logic circuit can also comprise a synchronisation input that controls two additional switches of the first and second devices for discharging in such a way that said synchronisation input maintains one or the other of the additional switches closed providing the connection between the first output or the second output respectively and the supply and synchronisation input, in an inactive phase of the logic circuit.

The first, second logic switches, the first and second discharge switches and the first and second grounding switches can be controlled by electrostatic forces, magnetic forces or piezoelectric forces.

Another subject-matter of this invention is an integrated circuit comprising at least one logic circuit according to this invention.

The integrated circuit can comprise at least one first and a second logic circuits according to the invention, with the first output of the first logic device of the first circuit applying an input signal to the first input of the first logic device of the second circuit and the second output of the second logic device of the first circuit applying an input signal to the second input of the second logic device of the second circuit.

BRIEF DESCRIPTION OF THE DRAWINGS

This invention shall be better understood using the following description and the annexed drawings wherein.

DETAILED DESCRIPTION OF PARTICULAR EMBODIMENTS

This invention relates to logic circuits as dynamic logic of the "dual rail" type, implementing a logic function and the inverse function.

The logic function is designated as F and the inverse function is designated as Fb. The inputs and outputs relating to the inverse function comprise the index b in order to distinguish them from the inputs and outputs of the logic function F.

The logic circuits according to the invention comprise mechanical switches, more particularly nanoswitches or microswitches carried out with NEMS (Nanoelectromechanical Systems) or MEMS (Microelectromechanical Systems) technology. At least the closing of these switches can be controlled by electrostatic means, by application of a magnetic field, by piezoelectric effect, by thermal effect or by magnetic means. For the purposes of simplicity, the "nano and microswitches" will be designated solely by "mechanical switches". Examples of such mechanical switches shall be described in what follows.

In the embodiments that are going to be described the mechanical switches are with electrostatic actuation.

Generally, for all of the switches of the circuit of the invention, the control voltages are referenced advantageously in relation to a fixed potential such as the ground.

Figure 1:
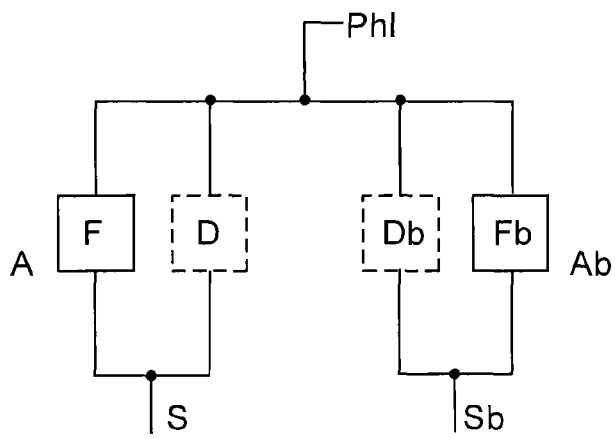
FIG. 1 diagrammatically shows a block diagram of a logic circuit according to this invention, FIG. 2A diagrammatically shows an embodiment of a logic circuit according to a first embodiment.

In FIG. 1, a block diagram can be seen of a logic circuit according to the invention.

The logic circuit comprises the function F of the logic type controlled by one or several inputs designated as A, the inverse function Fb controlled by one or several complementary inputs Ab, one or several outputs S and one or several complementary outputs Sb. The functions F and Fb comprise at least one mechanical switch.

The logic circuit has a first supply and synchronisation input or clock, designated as Phi, connected to a source of adiabatic supply voltage.

Figure 8:
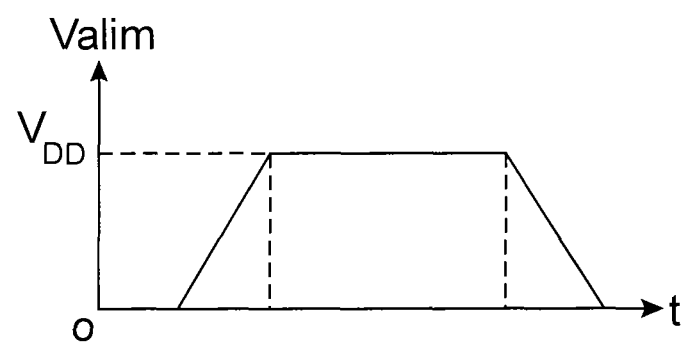

For example, the source of the supply voltage is such that the supply voltage is not constant and varies according to a trapezoidal profile. The variation in the voltage $V_{alim}$ is diagrammatically shown in FIG. 8. In a first phase I, the supply voltage increases progressively from 0 until it reaches the nominal voltage $V_{DD}$, during a time T, which makes it possible to establish the output level then to transmit this level to the following gates. In a second phase II, the supply voltage $V_{alim}$ is maintained during a certain time at the nominal voltage $V_{DD}$ and then, during a third phase III, the supply voltage $V_{alim}$ decreases during the time T in order to reset the system before processing another logic event. The time for increasing the voltage and the time for decreasing the voltage are preferably substantially equal. Furthermore, the time during which the voltage is constant is substantially constant. In practice, the trapezoidal profile is approximated by a half-sinusoid.

In the adiabatic logic also called "energy recovery logic", the energy stored in the capacitor of interconnection is not discharged to the ground as in the CMOS logic, which necessarily introduces a dissipation, but to the supply that was used to charge it. A major portion of the energy is therefore recovered by the supply. The adiabatic logic is also called energy recovery logic.

In adiabatic logic, the supply voltage varies over time according to a trapeze law. In practice it is rather difficult carry out a variation of this type and a half-sinusoid constitutes a satisfactory approximation of the trapezoidal law. To generate such a voltage, an oscillating circuit can be used. The latter can comprise inductance is in series with the logic circuit, with the oscillating circuit being excited at the chosen frequency. A circuit based on a bank of capacitors can also be used to approximately generate a trapezoidal voltage. The capacitors are discharged sequentially then recharged sequentially when the line is reset and when the energy is recovered.

The first supply and synchronisation input Phi is connected to the logic function F as well as to the inverse function Fb.

The input signals are also adiabatic in order to be able to connect several logic circuits in cascade.

Furthermore, the logic circuit comprises first means for discharging D allowing the output S to be discharged to the first supply and synchronisation input Phi, and second means for discharging Db allowing the complementary output Sb to be discharged to the first supply and synchronisation input Phi.

The means D and DB provide the connection between the output S and Sb respectively and the first supply and synchronisation input Phi when the signal at the output is 1 and maintain this connection when the input A or Ab has switched back to 0 and at the latest until the input A or Ab starts to rise back up to 1.

These means D and Db then allow the output S and Sb respectively to be discharged at least partially adiabatically to the first supply and synchronisation input Phi. This at least partially adiabatic discharge makes it possible to reduce the electrical consumption of the logic circuit in relation to transistor logic circuits.

Furthermore, these means D and Db make it possible to maintain the outputs at the state 0 during the inactive phase, i.e. when no input signal is applied to the input A.

Practical embodiments of logic circuits according to this invention shall now be described.

Figure 2A:
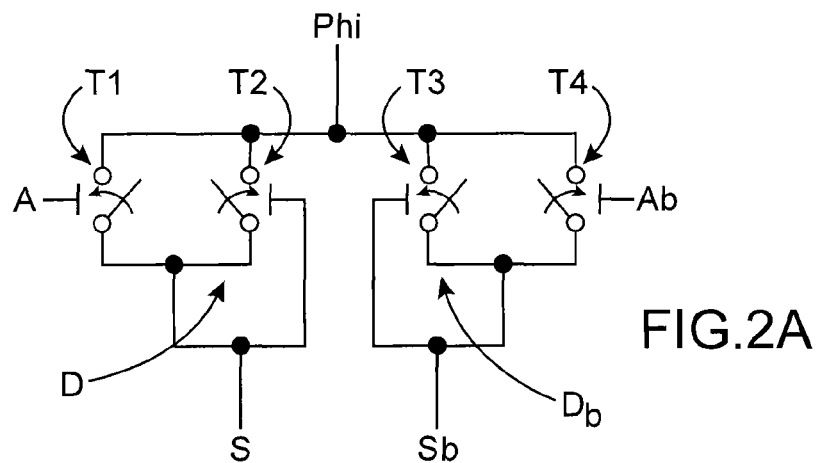
FIG. 2B shows the chronograms of the signals at the various inputs and outputs of the logic circuit of FIG. 2A, FIG. 3 diagrammatically shows another example of a logic circuit according to a first embodiment, FIG. 4 diagrammatically shows another example of a logic circuit according to a first embodiment, FIG. 5A diagrammatically shows an embodiment of a logic circuit according to a second embodiment.

FIG. 2A shows a first embodiment of a logic circuit that forms an inverter.

In this first embodiment, the logic function F is performed by a mechanical switch T1 and the complementary function Fb is performed by a mechanical switch T4.

The means for discharging D are also formed by a mechanical switch T2 and the means Db are formed by a mechanical switch T3.

Mechanical switches have a conducting closed state when a voltage that is greater than the closing threshold is applied to them, designated as VPC. The conducting closed state represents the state 1. Mechanical switches have an open state when a voltage less than or equal to a closing threshold is applied to them, this voltage is designated as VPR. The non-conducting open state represents the state 0. The VPC and VPR voltages are in general different.

In this application, the expressions "closed switch" and "conductor switch" "passing switch" are considered to be synonyms. In this application, and the expressions "open switch" and "non-conductor switch" or "blocked switch" are considered to be synonyms.

Figure 7:
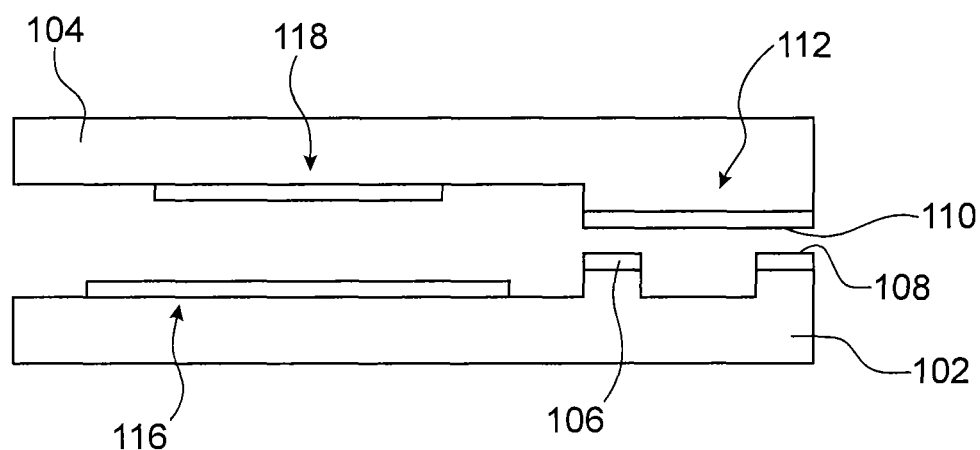

FIG. 7 shows an example of a switch controlled in terms of closing with electrostatic actuation.

The switch comprises a fixed portion 102 and a mobile portion 104.

The fixed portion 102 comprises a first conductor track 106 and a second conductor track 108 which are intended to be put in contact at the closing of the switch. The mobile portion 104 comprises a conductor track 110 comprising a protruding element 112, with this protruding element 112 being intended to come into contact with the conductor tracks 106 and 108 when the mobile portion 104 is brought close to the fixed portion 102 and to ensure the conduction between the two conductor tracks 106, 108.

The switch comprises means for the electrostatic control in terms of closing comprising an electrode 116 on the fixed portion 102 and an electrode 118 on the mobile portion, with the electrodes 116 and 118 facing each other. When a voltage is applied between the two electrodes 116, 118 an electrostatic attraction appears between the electrodes causing a coming together of the mobile portion 104 with the fixed portion 102; when this voltage is sufficient, the element 112 comes into contact with the conductor tracks 106, 108 *r* and causes the switch to close. When the control voltage is insufficient, the mobile portion returns to its initial position which interrupts the conduction between the tracks 106, 108.

In the example shown, the mobile portion 104 is formed by a beam. Alternatively, the suspended elements can be formed by a membrane.

Figure 2B:
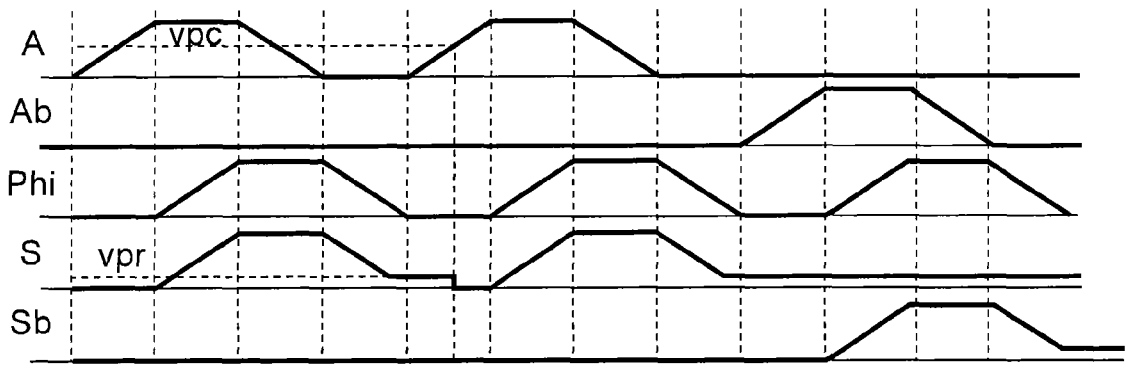

The operation of this logic circuit shall now be described. FIG. 2B shows the variations in state of the inputs A, Ab, of the outputs S, Sb and of the clock Phi as a function of time.

First of all, an input signal is for example applied to the input A in such a way as to position it to "1", the input Ab is thus "0". The input signal can be seen in FIG. 2B and varies adiabatically.

When the voltage in A reaches VPC, the mechanical switch T1 is closed and becomes a conductor. The other switches T2, T3 and T4 are open because at the start of the cycle all of the voltages are at zero.

The first supply and synchronisation input Phi then applies a supply voltage which increases from 0 to $V_{DD}$. Due to the closing of T1, the output S undergoes the same voltage variation as can be seen in FIG. 2B. The output Sb remains at 0V.

The voltage VPC is less than the voltage Vdd. The voltage at the output S increasing until Vdd, reaches and exceeds the value VPC, causing the closing of the mechanical switch T2 which becomes a conductor.

The input signal applied to the input A, varying adiabatically, the voltage applied to the input A and therefore to the mechanical switch T1 decreases and becomes less than VPR, T1 then is opened and is no longer a conductor. The output S remains however connected to the first supply and synchronisation input Phi by the mechanical switch T2. However the voltage at the first supply and synchronisation input Phi decreases adiabatically, the voltage at the output S then also decreases adiabatically. When the voltage at the output reaches VPR, the mechanical switch T2 is opened, thus isolating the output of the clock Phi. The output S thus remains at the voltage VPR.

As has been explained hereinabove, the interconnection line at the output forms a capacitor, the voltage VPR is thus applied at the terminals of the interconnection capacitor of the output. This voltage remains at this value in the next cycle if the input A is in the state "0" and is discharged to the first supply and synchronisation input Phi if in the cycle that follows the input A is "1", since the output S will again be connected to the first supply and synchronisation input by the mechanical switch T1. In the example shown, in the cycle following the input A switches to 1 which causes the discharging of the output S.

The discharging of the voltage VPR is not adiabatic and is equal to ½ $CV_{PR}^2$. On the one hand the energy discharged in a non-adiabatic manner by the logic circuit according to the invention is substantially lower in relation to logic circuits of the current state of the art, as it is only a portion of the energy that is lost by the logic circuits of the current state of the art. On the other hand, this energy can be reduced by choosing the type of mechanical switch implemented, in particular by optimising the forces of adhesion. Indeed, contrary to transistors, a low value of voltage VPR does not cause an increase in the value of the leakage current of the mechanical switch, since the latter does not have any leakage current. The forces of adhesion can be modified and adjusted by varying the size of the contact electrodes, the roughness of the contact electrodes and the nature of the materials used. The value of the voltage applied on the gate also modifies the force applied and therefore the forces of adhesion.

It is observed that the output signal has the same duration as the input signal which makes it possible to connect the logic gates in cascade.

This logic circuit is of simple structure, implements simple mechanical switches and it uses only one first supply and synchronisation input, i.e. a single control signal for all of the mechanical switches. Moreover, the voltages at the inputs, outputs at the first supply and synchronisation input have the same profile which simplifies the supply.

In the operation described hereinabove, it is the input of the logic function which switches to state 1, but it can be provided that it is the complementary input Ab that switches to 1 and the input 1 that remains at 0, the operation is similar to that described hereinabove by switching the mechanical switches T3 and T4.

The FIG. 2B shows the case where it is the complementary input Ab which switches to 1 during the third cycle. In this case the output S remains at 0 and it is the complementary output Sb which varies in a manner similar to the output S in the first two cycles. At the end of the third cycle the switch T3 is closed, isolating the output Sb. It is observed that the output S remains charged during the third cycle since the input remained at 0. In the fourth cycle (not shown), if the input A switches to 1 it will be the output S that is discharged and if it is the input Ab it is the output Sb.

The values VPR and VPC are more preferably equal for all of the mechanical switches which allows for collective manufacture. Alternatively, it can be provided to have families of switches with the same characteristics.

Figure 3:
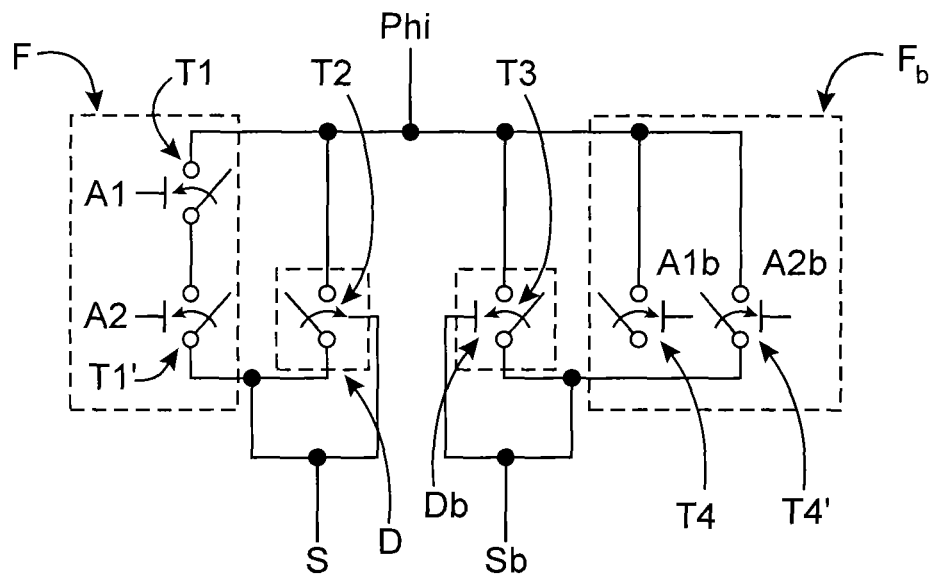

FIG. 3 shows another example of a logic circuit according to the first embodiment. In this example, the logic function is an AND function with two inputs A1 and A2. It is performed by two mechanical switches T1 and T1' and the complementary function also has two inputs A1b and A2b and is performed by two mechanical switches T4 and T4'. Each input controls a mechanical switch. As for the example of FIG. 2A, the means D and Db are each formed by a mechanical switch.

The operation of this logic circuit is similar to that of FIG. 2B, it differs in that the initial connection between the first supply and synchronisation input Phi and the output S is controlled by the switching of two switches instead of one.

Different and more complex logic functions can be carried out according to the same principle (or, exclusive or, nand, nor, Toffoli gate, Fredkin gate, Feynman gate, etc.).

Figure 4:
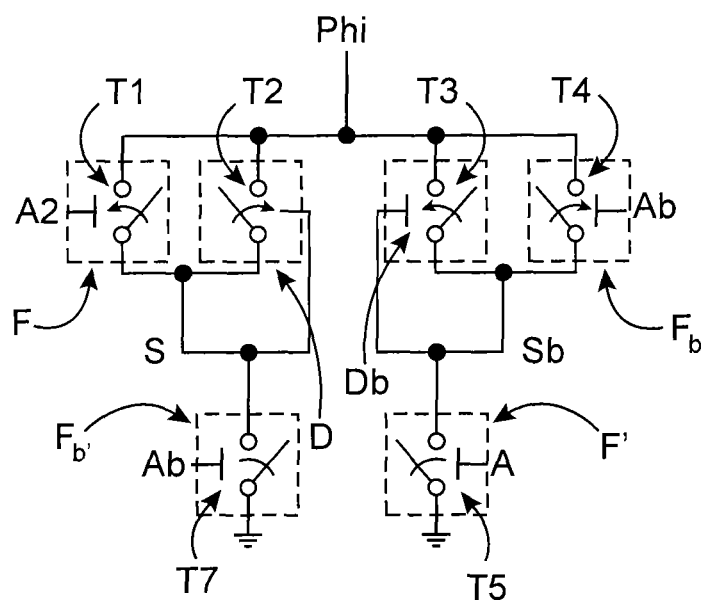

In FIG. 4, another example of an inverter logic circuit comprising returns to the ground can be seen.

The logic circuit comprises a complementary logic gate Fb' of the logic function F that connects the output S to the ground, with this logic gate Fb' being controlled by the input Ab. The logic circuit also comprises a complementary logic gate F' of the complementary logic gate Fb that connects the output Sb to the ground, with this logic gate F' being controlled by the input A.

The complementary logic gate Fb' comprises a switch T7 positioned between the complementary output S and the ground and the logic gate F' comprises a switch T7 positioned between the complementary output Sb and the ground. As such when the switch T1 controlled by the input A, is closed, the switch T7 controlled by the complementary input Ab, is opened, and inversely.

The operation of this logic circuit is similar to that of FIG. 2A, it differs from the latter when the voltage in S reaches the value VPR and the switch T2 is open. In this embodiment, the voltage VPR that remains on the output S is then drained to the ground in the case where in the following cycle the input A is at "0". The input Ab is then in the state "1" which connects the output S to the ground, due to the closing of the switch T7 which is in a state opposite that of T1. This embodiment makes it possible to prevent the output nodes from remaining at a floating voltage for a too long period of time, if for example the following state or states taken by the input A were 0, which prevents the logic circuit from being able to be disturbed by electrostatic charges.

Figure 5A:
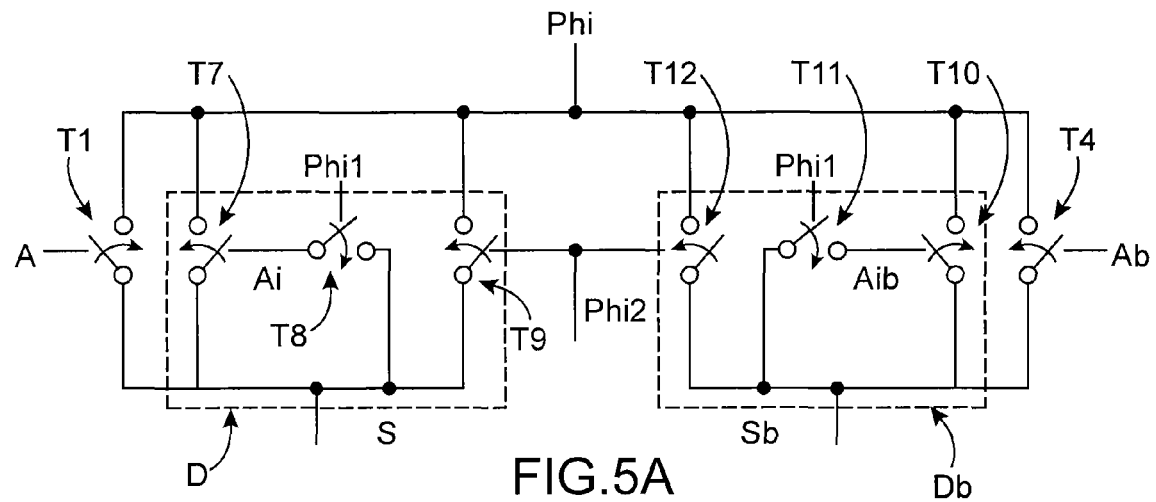
FIG. 5B shows the chronograms of the signals at the various inputs and outputs of the logic circuit of FIG. 5A, FIG. 6A diagrammatically shows an embodiment of a logic circuit according to a third embodiment.
Figure 5B:
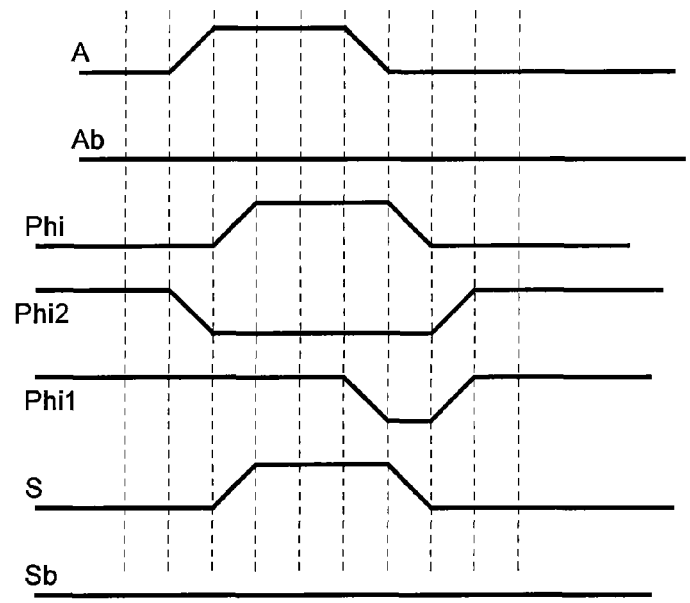

FIG. 5A shows a second embodiment of a logic circuit according to the invention. FIG. 5B shows the chronograms of the signals at the inputs, outputs and control synchronisation inputs.

In this embodiment, the logic function comprises a mechanical switch T1 controlled by the input signal A. The means for discharging D comprise three switches T7, T8 and T9. The switch T8 is controlled by a first synchronisation input Phi1 and the switch T9 is controlled by a second synchronisation input Phi2. The inverse function has a symmetrical structure, the input comprises a switch T4 controlled by the input sign Ab, and the means Db comprises three switches T10, T11 and T12.

The switch T11 is controlled by the first synchronisation input Phi1 and the switch T12 is controlled by the second synchronisation input Phi2.

The operation of this logic circuit shall now be explained using the chronograms of FIG. 5B.

First of all, an input signal is for example applied to the input A in such a way as to position to "1", the input Ab is therefore "0", i.e. the input signal A increases from 0 to VDD and therefore exceeds VPC. The input signal can be seen in FIG. 5B and varies adiabatically. All of the voltages are initially at 0V except Phi1 and Phi1 which are at VDD therefore T9, T12, T8 and T11 are the only switches that are passing. The mechanical switch T1 is therefore closed and a conductor when A reaches VPC The first supply and synchronisation input Phi then applies a supply voltage which increases from 0 to $V_{DD}$. Due to the closing of T1, the output S undergoes the same voltage variation as can be seen in FIG. 5B. The output Sb remains at 0V.

The voltage at the output S increases to reach at least the value VPC, which causes the closing of the mechanical switch T7, with the switch T8 being closed. The switch T7 becomes a conductor.

The input signal applied to the input A, varying adiabatically, the voltage applied at the input A and therefore to the mechanical switch T1 then decreases and passes under VPR, T1 is opened and is no longer a conductor. The output S remains however connected to the clock Phi by the mechanical switch T7.

The first synchronisation input Phi1 switches to the state 0, while Phi and the output S are at state 1. The switch T8 becomes open, isolating the node Ai. The voltage at the node Ai is the voltage at the terminals of a capacitor Ci formed by the input of T7 and the short interconnection between T7 and T8. In this phase this capacitor is electrically isolated since T8 is open. The voltage at the terminals therefore retains its value Vdd and T7 remains a conductor.

The voltage at the clock Phi decreases adiabatically, the voltage at the output S then also decreases adiabatically and this during the entire duration of the discharge, T7 being a conductor. The output is this fully discharged to 0V. The capacitor in Ai on the other hand is discharged to 0V in a non-adiabatic manner in the following period when Phi1 rises back to Vdd since it is then connected at 0V by T8. An energy $\frac{1}{2} \cdot Ci \cdot Vdd^2$ will therefore be dissipated.

The second synchronisation input Phi2 switches to 1 in the active phase, i.e. when no signal is sent as input. The switch 9 is closed providing the connection between the first supply and synchronisation input Phi and the output S in the inactive phase.

The embodiment makes it possible to obtain a fully adiabatic dissipation of the energy, other than the discharge of the internal nodes Ai and Aib.

Note that in this embodiment, it can be considered to not implement the switches T9, T12 and the signal Phi2 because they are used to prevent the outputs S and Sb from remaining at a floating potential too long.

Figure 6A:
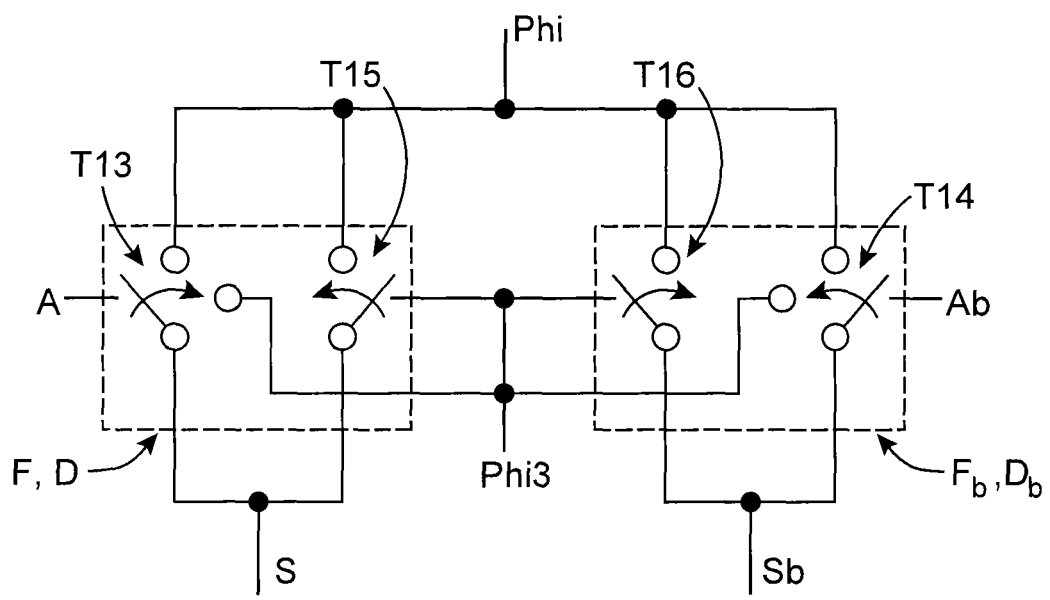
FIG. 6B shows the chronograms of the signals at the various inputs and outputs of the logic circuit of FIG. 6A, FIG. 7 diagrammatically shows an embodiment of a switch that can be implemented in a logic circuit according to the invention, FIG. 8 graphically shows the variation in the supply voltage as a function of time in adiabatic logic.

FIG. 6A shows a third particular advantageous embodiment also allowing for a fully adiabatic dissipation of the energy to the nearest internal capacitor discharge.

In this third embodiment, the mechanical switch T13 performs the logic function F, provides for the discharging of the output S, and thus forms a portion of the means for discharging D, and the mechanical switch T14 of the complementary function Fb also provides for the discharging of the output Sb and thus forms a portion of the means for discharging Db. For this, at least the switches T13 and T14 are bistable switches.

"Bistable switch" in this application means a switch that is closed by the application of a closing voltage and retains the closed state even when the closing voltage is no longer applied, and requires the application of an opening voltage on an additional electrode in order to be opened. These are switches controlled in terms of closing and opening.

The means D are also advantageously formed by a mechanical switch T15 and the means Db are advantageously formed by a mechanical switch T16.

This switch comprises in addition to the elements described for the simple switch another control electrode that makes it possible to place the switch of the bistable type in the open state by applying a voltage also called VPR. Contrary to the simple switch, the bistable switch remains closed after a switching even if the control voltage switches back to 0V. For example, the forces of adherence to the condition that they are higher than the mechanical forces allow for this operation.

An example of a bistable switch is for example described in the document Owen Y. Loh and Horacio D. Espinosa, *Nanoelectromechanical contact switches*, Nature Nanotechnology, Apr. 29, 2012.

The logic circuit comprises a synchronisation input Phi3 that controls the opening of the switches 13 and 14, and it also controls the closing of the switches T15 and T16. In the example shown, the switches T15 and T16 are controlled only for closing, in the absence of voltage, the switches are opened.

Figure 6B:
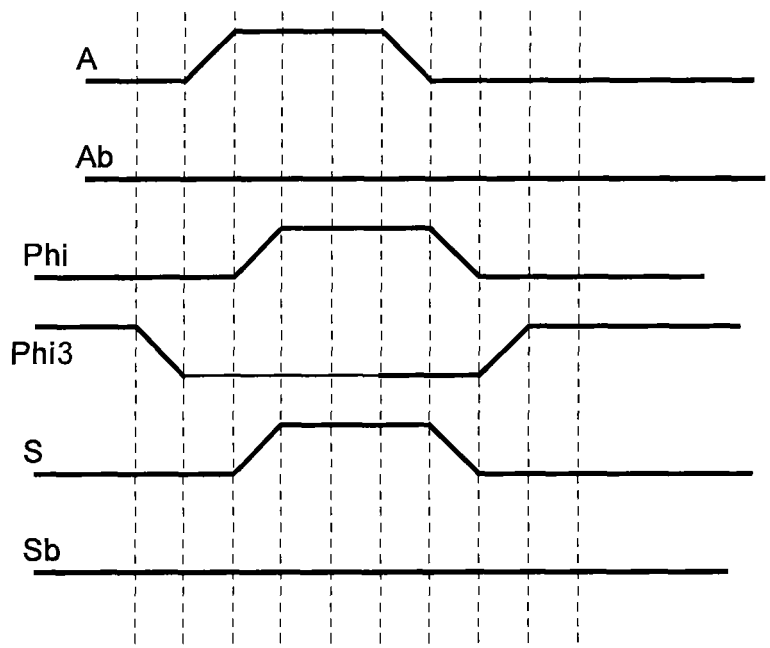

The operation of this logic circuit shall now be described using the chronograms of FIG. 6B.

In the initial state, Phi3 is at the state 1; T13 and T14 are therefore open, while T15 and T16 are closed connecting S and Sb to Phi which is at the state 0.

First of all, the clock Phi3 switches to the state 0, causing the opening of the switches T15 and T16.

Then, an input signal is for example applied to the input A in such a way as to position it to "1", the input Ab is therefore "0", i.e. the input signal A applies a voltage at least equal to VPC. The input signal can be seen in FIG. 6B and varies adiabatically.

The mechanical switch T13 is therefore closed and is a conductor when A reaches VPC, the complementary switch T14 is opened.

The first supply and synchronisation input Phi then applies a supply voltage which increases from 0 to $V_{DD}$. Due to the conductor state of T13, the output S undergoes the same voltage variation as can be seen in FIG. 5B. The output Sb remains at 0V.

The input signal applied to the input A, then switches to the state 0. But because of the bistable property of the switch T13, the latter remains at the conductor state. The switch T13 provides the connection between the output S and the first supply and synchronisation input Phi. As the voltage at the first supply and synchronisation input Phi decreases adiabatically, the voltage at the output S thus also decreases adiabatically. The output S remains connected to the first supply and synchronisation input Phi until it is fully discharged. When the output S is fully discharged, the synchronisation input Phi3 switches to the state 1 which opens the switch T13 (T14 is already open) and which closes the switches 15 and 16. The synchronisation input Phi3 is used to place the bistable switches back into a blocked state, once the output is discharged, and to provide a connection between the outputs S and Sb and the first supply and synchronisation input Phi during the inactive phase by the switches T15 and T16.

Alternatively, it can be considered to use in place of the switches T15 and T16 controlled only in terms of closing, bistable switches, which makes it possible to simplify the method of manufacturing by reducing the number of different components. An additional synchronisation input derived directly from Phi3 is then provided to control in terms of opening the bistable switches T15 and T16. The additional synchronisation input can be separate from the synchronisation input Phi3.

This logic circuit allows for a fully adiabatic dissipation of energy. Furthermore, it has the advantage of implementing only two synchronisation inputs in relation to second embodiment and is simpler to carry out.

Note that in this embodiment, it can be considered to not implement the switches T15 and T16 because they are used to prevent the outputs S and Sb from remaining at a floating potential too long.

The logic circuits according to the invention can be carried out by silicon technologies, but is not limited to this. According to the degree of miniaturisation sought, mechanical technologies can be in certain cases better suited than semiconductor-based technologies in order to obtain very low consumption performance.

It shall be understood that all of the logic circuits can be carried out using the three embodiments described. Combining these three modes into the same logic circuit can be considered.

The logic circuits of the invention are particularly interesting for applications that require very low consumption, such as for example portable autonomous systems.

Systems with a high degree of parallelisation, which require operating frequencies by block that are rather low, can also use such circuits.

The invention claimed is:

1. Adiabatic logic circuit having at least one first and one second inputs, one first and one second outputs, and at least one supply and synchronisation input, with the adiabatic logic circuit comprising:
   a first logic device comprising at least one first microelectromechanical and/or nanoelectromechanical switch, referred to as first logic switch, at least partially controlled by the first input and connected to the first output and to the supply and synchronisation input;
   a second logic device referred to as complementary providing a complementary logic function of the first logic device comprising at least one second microelectromechanical and/or nanoelectromechanical switch, referred to as second logic switch, at least partially controlled by the second input and connected to the second output and to the supply and synchronisation input; and
   first and second devices for discharging connected respectively between the first output and the supply and synchronisation input and between the second output and the supply and synchronisation input, said first and second devices for discharging configured to provide a discharge at least partially of the first and second outputs, said first and second devices for discharging comprising respectively at least one switch,
   wherein the first logic device and the second logic device are directly connected to the supply and synchronisation input.

2. Adiabatic logic circuit according to claim 1, wherein the switches of the first and second devices for discharging are hysteresis cycle switches.

3. Adiabatic logic circuit according to claim 1, wherein the first and the second device for discharging comprise respectively at least one microelectromechanical and/or nanoelectromechanical switch, referred to as discharge switch.

4. Adiabatic logic circuit according to claim 1, wherein the first output is connected to the ground by the intermediary of a third complementary logic device of the first logic device and controlled by the second input and the second output is connected to the ground by the intermediary of a fourth complementary logic device of the second logic device and controlled by the first input.

5. Adiabatic logic circuit according to claim 4, wherein the third complementary logic device comprises a first microelectromechanical and/or nanoelectromechanical connection switch to the ground, said first connection switch to the ground being controlled in such a way as to be in a state opposite that of the first logic switch, and the fourth complementary logic device comprises a second microelectromechanical and/or nanoelectromechanical connection switch to the ground, said second connection switch to the ground being controlled in such a way as to be in a state opposite that of the second logic switch.

6. Adiabatic logic circuit according to claim 5, wherein the first and second connection switches to the ground are configured to be controlled by electrostatic forces, magnetic forces, or piezoelectric forces.

7. Adiabatic logic circuit according to claim 1, wherein all or a portion of the first and the second logic switches are bistable switches.

8. Adiabatic logic circuit according to claim 1, wherein the first and second devices for discharging are configured to be controlled respectively by the first output and the second output.

9. Adiabatic logic circuit according to claim 1, wherein the at least one supply and synchronisation input comprises at least one first synchronisation input and one second synchronisation input, and with each of the first and second devices for discharging comprising at least three microelectromechanical and/or nanoelectromechanical switches,
   wherein one of the three switches of the first device for discharging is configured to perform the connection between the first output and the supply and synchronisation input, another from among the three switches of the first device for discharging is controlled by the first synchronisation input in such a way as to maintain the connection between the first output and the supply and synchronisation input until the first output is fully discharged, by maintaining said connection switch as a conductor, and the second synchronisation input provides the connection between the first output and the supply and synchronisation input by closing another of the three switches of the first device for discharging in an inactive phase of the logic circuit, and
   wherein one of the three switches of the second device for discharging, referred to as connection switch, is configured to perform the connection between the second output and the supply and synchronisation input, another from among the three switches of the second device for discharging is controlled by the first synchronisation input in such a way as to maintain the connection between the second output and the supply and synchronisation input until the second output is fully discharged, by maintaining the connection switch as a conductor, and the second synchronisation input provides the connection between the second output and the supply and synchronisation input by closing another of the three switches of the second logic discharge device in an inactive phase of the logic circuit.

10. Adiabatic logic circuit according to claim 1,
wherein the first logic switch of the first logic device forms a portion of the first device for discharging, said first logic switch being configured to be controlled in terms of closing and opening, said first logic switch being configured to be controlled in such a way as to provide for the full discharge of the first output, and
wherein the second logic switch of the second logic device forms a portion of the second device for discharging, said second logic switch being configured to be controlled in terms of closing and opening, said second logic switch being configured to be controlled in such a way as to provide for the full discharge of the second output.

11. Adiabatic logic circuit according to claim 10, comprising a synchronisation input that is configured to control two additional switches of the first and second devices for discharging in such a way that said synchronisation input maintains one or the other of the additional switches closed providing the connection between the first output or the second output respectively and the supply and synchronisation input, in an inactive phase of the logic circuit.

12. Adiabatic logic circuit according to claim 1, wherein the first and second logic switches, and the first and second discharge switches, are configured to be controlled by electrostatic forces, magnetic forces, or piezoelectric forces.

13. A logic circuit comprising at least one adiabatic logic circuit according to claim 1.

14. An integrated circuit comprising the logic circuit according to claim 13, comprising at least one first and one second logic circuits, with the first output of the first logic device of the first logic circuit configured to apply an input signal to the first input of the first logic device of the second logic circuit, and with the second output of the second logic device of the first logic circuit configured to apply an input signal to the second input of the second logic device of the second logic circuit.

* * * * *